(12) United States Patent
Bradley et al.

(10) Patent No.: US 9,871,182 B2
(45) Date of Patent: Jan. 16, 2018

(54) FREQUENCY TRACKING PIEZOELECTRIC TRANSFORMER POWER CONVERTER WITH SIMULTANEOUS TWO-PARAMETER CONTROL

(71) Applicants: William M. Bradley, Lewisburg, PA (US); Ross W. Bird, Canton, PA (US); Gareth J. Knowles, Williamsport, PA (US); Jonathan M. Zook, Muncy, PA (US); Dennis L. Eldred, Jr., Williamsport, PA (US)

(72) Inventors: William M. Bradley, Lewisburg, PA (US); Ross W. Bird, Canton, PA (US); Gareth J. Knowles, Williamsport, PA (US); Jonathan M. Zook, Muncy, PA (US); Dennis L. Eldred, Jr., Williamsport, PA (US)

(73) Assignee: QorTek, Inc., Williamsport, PA (US)

( * ) Notice: Subject to any disclaimer, the term of this patent is extended or adjusted under 35 U.S.C. 154(b) by 0 days.

(21) Appl. No.: 14/777,385

(22) PCT Filed: Mar. 17, 2014

(86) PCT No.: PCT/US2014/030380
§ 371 (c)(1),
(2) Date: Sep. 15, 2015

(87) PCT Pub. No.: WO2014/145587
PCT Pub. Date: Sep. 18, 2014

(65) Prior Publication Data
US 2016/0043298 A1 Feb. 11, 2016

Related U.S. Application Data

(60) Provisional application No. 61/791,270, filed on Mar. 15, 2013.

(51) Int. Cl.
*H01L 41/04* (2006.01)
*H02M 7/04* (2006.01)

(52) U.S. Cl.
CPC .......... *H01L 41/044* (2013.01); *H02M 7/043* (2013.01)

(58) Field of Classification Search
CPC ...... H01L 41/044; H01L 41/04; H02M 7/043; H02M 7/04
(Continued)

(56) References Cited

U.S. PATENT DOCUMENTS

4,879,528 A * 11/1989 Gotanda ............... H03L 7/02
310/316.01
5,731,652 A * 3/1998 Shimada ............... H01L 41/044
310/316.01
(Continued)

*Primary Examiner* — Jeffrey Gblende
*Assistant Examiner* — Kyle J Moody
(74) *Attorney, Agent, or Firm* — Cahn & Samuels, LLP (57) ABSTRACT

The present invention is directed to a piezoelectric transformer based power converter that exhibits efficient operating point tracking ability while providing output regulation by means of simultaneous two-parameter control of the converter power stage. A regulation control stage provides the power stage a regulation control signal indicative of the difference between the measured output parameter and a set-point reference, therefore continuously controlling the gain of the converter to result in a stabilized, regulated output. Additionally, a frequency control stage simultaneously provides the power stage with a frequency control signal correlative to the difference between the current and desired operating points of the piezoelectric transformer. The power stage then translates the frequency control signal into an adjustment to the operational frequency of the input signal to the piezoelectric transformer, as to continuously drive the operating point to the desired position.

4 Claims, 6 Drawing Sheets

(58) Field of Classification Search
USPC .................. 363/15, 16, 17, 21.01, 132, 140
See application file for complete search history.

(56) References Cited

U.S. PATENT DOCUMENTS

| | | | | |
|---|---|---|---|---|
| 5,942,835 | A * | 8/1999 | Furuhashi | H01L 41/044 310/316.01 |
| 6,087,757 | A * | 7/2000 | Honbo | H01L 41/044 310/316.01 |
| 6,268,681 | B1 * | 7/2001 | Yamaguchi | H05B 41/2822 310/316.01 |
| 6,407,480 | B1 * | 6/2002 | Nakanishi | H05B 41/2822 310/316.01 |
| 6,720,705 | B2 * | 4/2004 | Nakatsuka | H01L 41/044 310/316.01 |
| 7,579,749 | B2 * | 8/2009 | Murata | H01L 41/044 310/316.01 |
| 2001/0050513 | A1 * | 12/2001 | Takeda | H05B 41/2822 310/316.01 |
| 2002/0011764 | A1 * | 1/2002 | Nakatsuka | H01L 41/044 310/359 |
| 2002/0170548 | A1 * | 11/2002 | Masters | F02P 9/002 123/641 |
| 2009/0033303 | A1 * | 2/2009 | Kondo | H01L 41/044 323/283 |
| 2010/0302809 | A1 * | 12/2010 | Kosaka | H02M 3/33515 363/15 |

* cited by examiner

FREQUENCY TRACKING PIEZOELECTRIC TRANSFORMER POWER CONVERTER WITH SIMULTANEOUS TWO-PARAMETER CONTROL

This application claims the benefit of U.S. provisional Application Ser. No. 61/791,270, filed Mar. 15, 2013, which is hereby incorporated by reference.

FIELD OF THE INVENTION

The present invention relates to a piezoelectric transformer based power converter with simultaneous two-parameter control for high-efficiency power conversion and conditioning.

BACKGROUND TO THE INVENTION

Electrical power converters, including DC-DC, DC-AC, and AC-DC are critical components in almost all forms of modern electrical systems. The vast majority of modern isolated power converters are based around traditional magnetic transformers that utilize magnetic fields to provide transformation of electrical voltage and current. Recent advances in piezoelectric transformer technology have led to alternate methods for provision of electrical power transformation through mechanical vibration. Piezoelectric transformers provide some significant benefits over their magnetic counterparts, such as increased power density, low-profile form factors, and reduced electromagnetic emission and susceptibility, while their benefits do not come without cost.

Piezoelectric transformers are inherently resonant devices, or more generally, they must be operated near their resonant frequency in order to properly function. This necessity, when combined with their highly reactive nature, creates a unique set of challenges when utilizing them within electrical power conversion circuits. First, their resonant frequency is not a static value; the resonant frequency of the device will shift as a function of numerous electrical and environmental parameters, such as device temperature, electrical load, and mounting conditions. Their power transformation efficiency is also based on a complex relationship between electrical load and operation frequency, so in order to maximize electrical efficiency some form of frequency tracking or compensation is typically implemented within converter circuitry. Current trends in the art have demonstrated numerous methods to provide such frequency compensation, typically through electrical parameter measurements of the piezoelectric transformer input/output signals in order to derive an awareness of the operational state of the device with respect to its current resonant frequency. This has previously been accomplished by utilizing self-excitation or self-oscillating circuits where the operation frequency of the device is derived from its own output, while other methods utilized phase-locked loops to continually adjust the operation frequency to maintain an operating condition directly at or near the resonant frequency of the device. Predetermined frequency sweeps to actively search or scan for the desired frequency have also been previously demonstrated. Each of these methods effectively result in a frequency controlled or compensated system.

It is important to acknowledge at this point that the electrical voltage gain and impedance of piezoelectric transformers are significantly impacted by their respective operation frequency. Typically, the maximum gain and minimum electrical impedance occurs at the resonant frequency of the device, and the maximum efficiency point occurs slightly after the devices' resonant frequency. Generally, the gain of a piezoelectric transformer reduces as the operation frequency deviates from the devices current resonant frequency, thus creating an inherent relationship between the operation frequency and gain of the device.

The majority of electrical power converters contain some level of voltage or current regulation in order to be effective in application. Current trends in both magnetic and piezoelectric transformer applications are to provide this regulation by some type of electrical modulation, effectively controlling, or throttling, the power in the transformer circuit. This power throttle is then typically responsive to the error, or difference, between some variety of electrical parameter measurement and fixed or dynamic reference, resulting in a system with a stabilized or regulated output.

Recent related art has demonstrated numerous methods for provision of either frequency controlled or regulated output piezoelectric transformer based converter systems, but few have demonstrated effective methods to simultaneously provide both. In order to fully realize the benefits of piezoelectric transformer based converters, dynamic closed-loop control of the operation frequency and output regulation must be simultaneously implemented on a continuous basis. The frequency dependent gain characteristics of piezoelectric transformers expose significant challenges when attempting to simultaneously maintain an optimal operation frequency and a voltage or current regulated system. Previous trends in the art have accomplished this by providing a limited level of control over one of the two parameters, such as utilizing a discontinuous style control of the output by effectively rapidly switching the system on and off, or utilizing a self-excited frequency generation scheme. While this does enable a form of control over both frequency and regulation its overall effectiveness is typically limited to specific applications.

A piezoelectric power converter system with both high-accuracy continuous frequency control, to maximize transformer efficiency, while simultaneously enacting high-speed continuous output regulation would demonstrate an exceptionally attractive candidate for full realization of the benefits of piezoelectric transformer based power conversion. Piezoelectric based converters have been previously targeted to niche applications, such as power supplies for cold-cathode fluorescent lamps and other high-voltage applications where limited regulation and frequency control are needed. A piezoelectric transformer based converter with high-accuracy simultaneous two-parameter control of both operation frequency and output voltage or current regulation has the potential to provide a direct replacement for a wide variety of magnetic based power converters. Such a system would demonstrate a viable alternate to traditional power converter approaches, while providing significant advancements in power conversion efficiency, electrical performance, size, and power density.

SUMMARY OF THE INVENTION

An objective of the present invention is to provide a high-efficiency piezoelectric transformer based power converter that utilizes simultaneous control of two operational parameters, namely operation frequency and output regulation.

Another objective of the invention is to provide a piezoelectric transformer based power converter that will operate both effectively and efficiently in a wide range of both environmental and electrical loading conditions through two-parameter simultaneous control.

Another objective of the invention is to enable a power converter solution that presents advances in the power density of DC-DC converters while maintaining a modular capability for a wide range of applications.

Another objective of the invention is to provide an alternate power converter technology to magnetic based approaches without presenting the drawbacks and negative features typically associated with piezoelectric transformer based power converters.

The invention in at least one embodiment provides a piezoelectric transformer power converter circuit including: a power stage including an amplifier with a controllable gain coupled to a piezoelectric transformer; a regulation control stage that generates a regulation control signal that is representative of the error between a desired electrical regulation set-point and a measured electrical parameter of the output of the power stage; a frequency control stage that generates a frequency control error signal that is representative of the error between a first and second measured operating parameter of the power stage; and a voltage controlled oscillator generates a frequency control signal having a periodic wave with a frequency controlled by the frequency control error signal; wherein the amplifier generates a piezoelectric drive signal, that includes an amplitude that is controlled by the regulation control signal, and a frequency that is simultaneously controlled by the frequency control signal, thereby maintaining a desired drive condition for an electrical load.

In a further embodiment, the piezoelectric transformer power converter circuit includes a rectifier coupled to the output of said piezoelectric transformer, and a filter coupled to the output of the rectifier, and adapted for a connection to an electrical load.

In a further embodiment to any of the above described embodiments, the piezoelectric transformer power converter circuit further includes a magnitude reference block providing a magnitude reference signal, a magnitude measurement block that measures a parameter of the load and generates a magnitude measurement signal, and a summing node that generates the regulation control signal.

In yet another embodiment to any of the previous embodiments, the piezoelectric transformer power converter circuit further includes a first operating parameter measurement block that generates a first output phase signal responsive to a first measured parameter of the piezoelectric transformer, a second operating parameter measurement block that generates a second output phase signal responsive to a second measured parameter of the piezoelectric transformer, a delay that creates a phase delay in the second output phase signal and generates an operating condition set point signal, and a summing node that generates a frequency control error signal from the difference between the first phase signal and the operating set point signal.

In still another embodiment, a piezoelectric transformer power converter circuit is provided that includes: a regulation control stage that generates a regulation control signal responsive to an electrical parameter measurement of the converter load, a frequency control stage that generates a frequency control signal responsive to an operating state measurement of a piezoelectric transformer, and a simultaneous control circuit that provides simultaneous control of the frequency and power output of a switch-mode power circuit responsive to the regulation and frequency control signals.

In a further embodiment to that of the previous paragraph, the piezoelectric transformer power converter circuit further includes a voltage controlled oscillator that generates a periodic output signal that's frequency is dictated by the frequency control signal, and a phase shift bridge control circuit that generates a set of signals that control the frequency and power output of a switch-mode power circuit responsive to the regulation and frequency control signals.

In yet another embodiment to that of the previous two paragraphs, the piezoelectric transformer power converter circuit further includes a first voltage measurement circuit that performs a phase measurement of input voltage of the piezoelectric transformer and generates a first phase signal, a second voltage measurement circuit that performs a phase measurement of the output voltage of piezoelectric transformer and generates a second phase signal, a delay line coupled to said second voltage measurement circuit that receives the second phase signal and creates a phase delay on the second phase signal, and a phase difference detector coupled to said first voltage measurement circuit and said delay line that outputs a signal corresponding to the difference in phase the first phase signal and the delayed second phase signal.

The invention in a further embodiment provides a method of operating a piezoelectric transformer power converter having a power stage, a regulation control stage, and a frequency control stage, the method including: measuring a parameter of the output of the power stage; generating a regulation control signal that is representative of the error between a desired electrical regulation set-point and a measured electrical parameter of the output of the power stage; measuring a first operating parameter and a second operating parameter of a power stage; generating a frequency control error signal that is representative of the error between the first and second measured operating parameters of the power stage; generating a frequency control signal having a periodic wave with a frequency responsive to the frequency control error signal; and generating a drive signal for a piezoelectric transformer that simultaneously controls (i) input power from a coupled input power source responsive to the regulation control signal, and (ii) operational frequency of the piezoelectric transformer responsive to the frequency control signal.

In still another embodiment the method includes subjecting one of the first and second operating parameter measurements to a phase delay thereby controlling an operating point lock location of the piezoelectric transformer.

In an additional embodiment, the method includes: generating an AC output signal of the piezoelectric transformer responsive to the piezoelectric transformer drive signal; and rectifying an AC output signal of the piezoelectric transformer to generate a DC output signal of the power stage.

DESCRIPTION OF THE EMBODIMENTS OF THE INVENTION

The present invention is directed to a piezoelectric transformer based power converter that exhibits efficient operating point tracking ability while providing output regulation by means of simultaneous two-parameter control of the converter power stage. A regulation control stage provides the power stage a regulation control signal representative of the difference between the measured output parameter and a set-point reference, therefore continuously controlling the gain of the converter resulting in a stabilized, regulated output. Additionally, a frequency control stage simultaneously provides the power stage with a frequency control signal representative of the difference between the current and desired operating points of the piezoelectric transformer. The power stage then translates the frequency control signal into an adjustment to the operational frequency of the input signal to the piezoelectric transformer, as to continuously drive the operating point of the piezoelectric transformer to the desired position.

Figure 1:
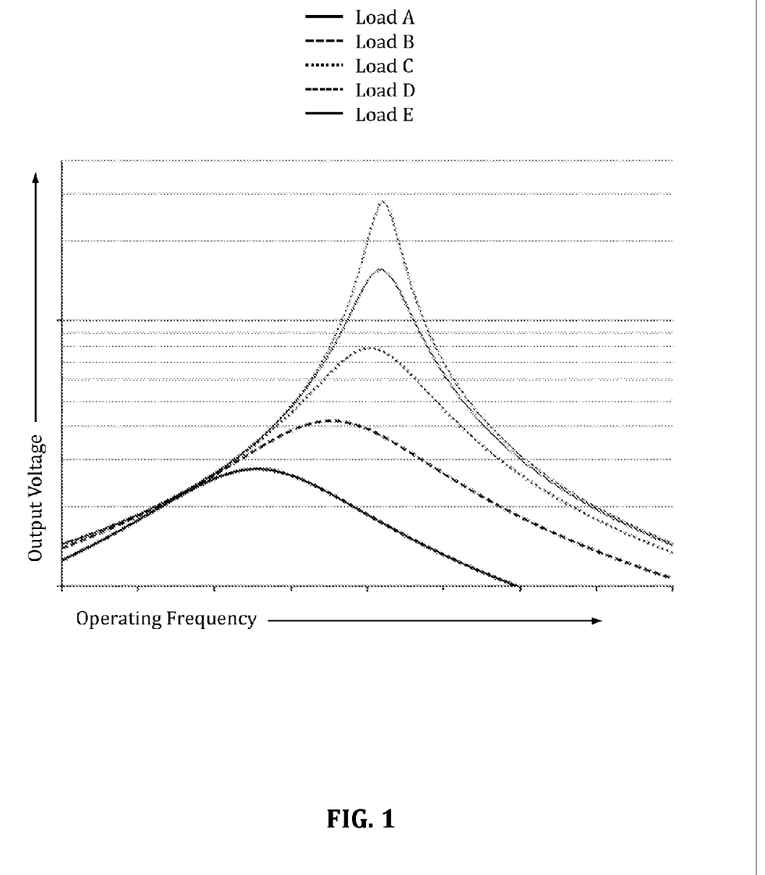
FIG. 1 depicts a graph of the output voltage of a piezoelectric transformer vs. frequency when subjected to varying electrical loading conditions.
Figure 2:
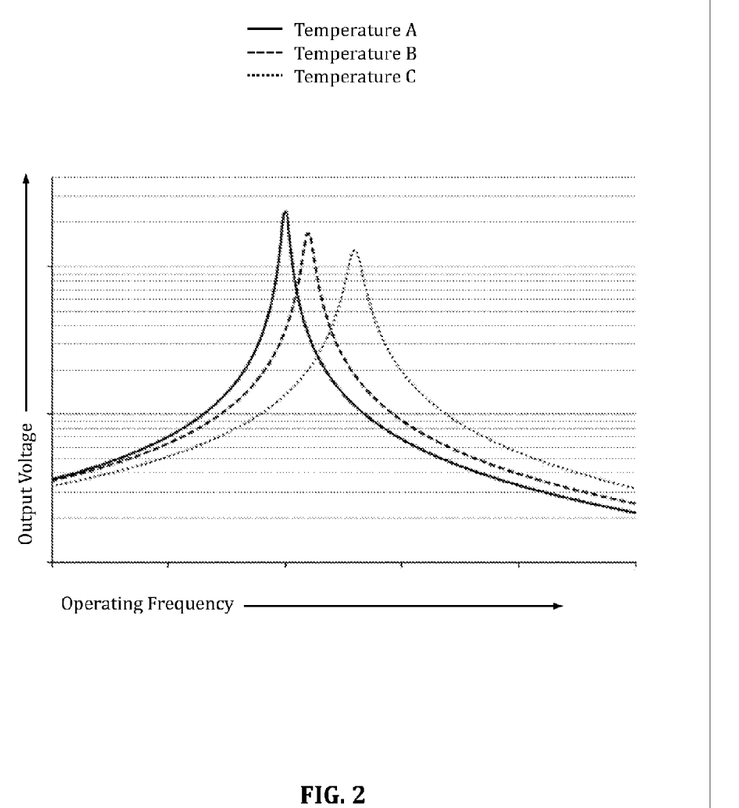
FIG. 2 shows a graph of the output voltage of a piezoelectric transformer vs. frequency while subjected to varying thermal conditions.

The nature of piezoelectric transformers causes these two control loops to be highly interactive. For example, a small change in operation frequency can have a drastic effect on the output voltage of the power converter due to the fact that piezoelectric transformers are high quality-factor (high stiffness) devices that operate near their resonant frequency. And conversely, it is well known that changes in a piezoelectric transformer based power converter's electrical load will considerably affect the resonant frequency of the piezoelectric transformer, as depicted in FIG. 1. Additionally, the piezoelectric material typically utilized in transformer fabrication also experiences significant electrical and mechanical change at different temperatures. This change in material properties causes an additional shift in resonant frequency of the piezoelectric transformer; a graphical representation of this temperature based frequency shift is shown in FIG. 2. The present invention enables the piezoelectric transformer based converter to maintain operation near maximum efficiency, via continuous operational frequency control while simultaneously performing continuous input stage amplifier throttling for regulation control. In the prior art, a sacrifice between maximum efficiency tracking or regulation control was typically made, as when throttling for regulation, the efficiency performance is sacrificed, or when tracking for maximum efficiency operation the regulation capability is sacrificed. The present invention embodies a circuit topology that enables simultaneous continuous control of both operating point for maximum efficiency tracking and power throttling for converter regulation with the described two-parameter dual feedback approach.

Figure 3:
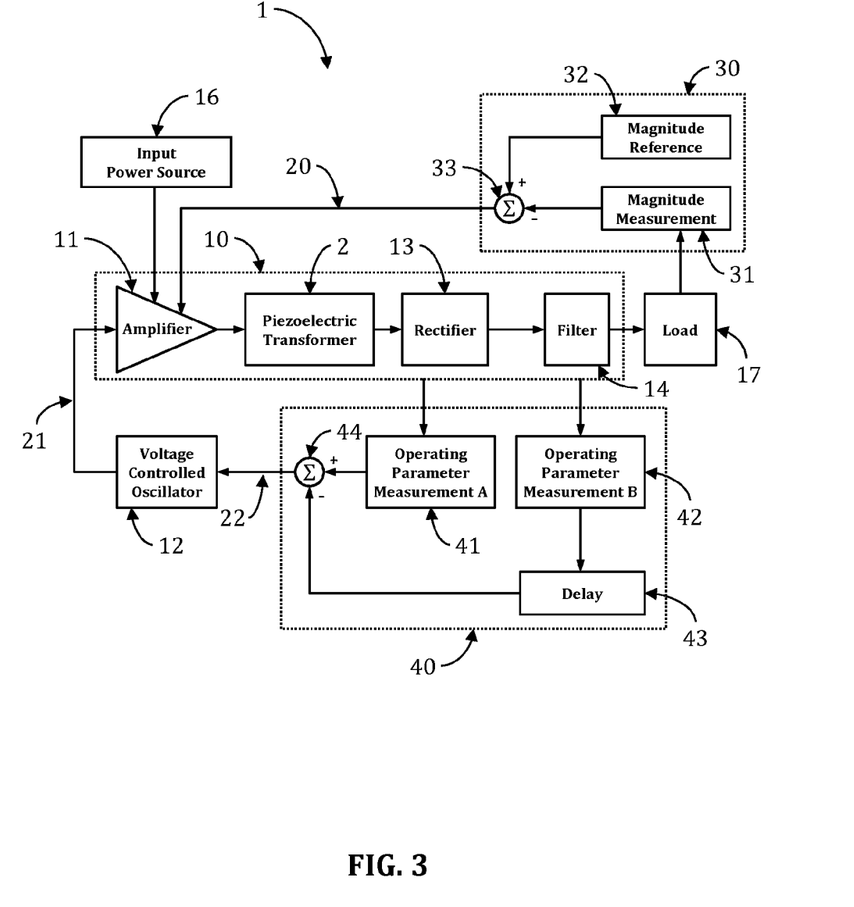
FIG. 3 illustrates a block diagram of a circuit in accordance with an embodiment of the invention.

In accordance with the invention, FIG. 3 illustrates a piezoelectric transformer power converter 1. Piezoelectric transformer power converter 1 includes power stage 10, regulation control stage 30, coupled to power stage 10 and a frequency control stage 40 also coupled to power stage 10, through voltage controlled oscillator 12. In accordance with the invention power stage 10 is comprised of amplifier 11 that provides simultaneous control of the input power delivered to, and the operational frequency of, a piezoelectric transformer 2, based upon regulation control signal 20 and frequency control signal 21. Amplifier 11 drives the piezoelectric transformer 2. It is well know that piezoelectric transformers require a resonant or near-resonant drive signal in order to function properly, this is also exemplified in the output voltage graph depicted in FIG. 1. Generally, amplifier 11 is comprised of a linear amplifier, switch-mode pulse-width modulated amplifier, or phase-shifted full-bridge driver or any other amplifier that exhibits the ability to have a variable gain based on an external regulation control signal 20. Amplifier 11 is configured to supply an input power signal to piezoelectric transformer 2 at or near resonance. Amplifier 11 translates the output signal from a voltage controlled oscillator 12 to an input power signal for piezoelectric transformer 2. Amplifier 11 is coupled to an input power source 16 to act as the primary source of the energy to be delivered to piezoelectric transformer 2, therefore amplifier 11 acts to modulate input power source 16 according to the input from voltage controlled oscillator 12. As such, voltage controlled oscillator 12 provides variable frequency control of the output power signal of amplifier 11. The frequency of voltage controlled oscillator 12 is controlled by frequency control error signal 22. In some embodiments, a reactive network may be interposed between the amplifier 11 and piezoelectric transformer 2. Generally, a reactive network is interposed to create a resonant tank between the added reactive network and the input capacitance of piezoelectric transformer 2, thus creating additional voltage gain at the transformer input while further acting to match the output impedance of amplifier 11 to the input impedance of piezoelectric transformer 2. Piezoelectric transformer 2 provides the primary power transfer mechanism for the converter. The selected geometry and configuration of piezoelectric transformer 2 enables control of the converter voltage transform ratio and typically adds some level of electrical isolation from the input to output of the device. Rectifier stage 13 and filter stage 14 transform the alternating current output from the piezoelectric transformer 2 to direct current to supply continuous current to the electrical load 17. In some embodiments the rectifier stage 13 and filter stage 14 can be omitted in order to provide an alternating current output to the electrical load 17. Additionally, numerous varieties of rectifier and filter circuits are applicable for use in the piezoelectric transformer based converter 1.

The first controlled parameter, input power, is managed by regulation control signal 20. Regulation control signal 20 controls the gain or power throttling of amplifier 11, and is derived within regulation control stage 30. The regulation control stage 30 includes magnitude reference block 32, magnitude measurement block 31, and summing node 33. Magnitude reference block 32 and magnitude measurement block 31 typically include a voltage or current measurement and corresponding reference. The magnitude measurement block 31 maintains an output proportional to the desired electrical output parameter to be regulated, typically current or voltage, and takes its input from the electrical load 17, via an inferred or direct measurement of an electrical parameter. Magnitude reference block 32 controls the set-point of the electrical parameter to be regulated and is scaled in order to be consistent with the proportionality of magnitude measurement 31. Summing node 33 returns the difference between magnitude reference block 32 and magnitude measurement 31 to the regulation control signal 20, thus controlling the gain of amplifier 11. For example, a five volt signal on magnitude reference block 32, when compared to the output voltage measurement from magnitude measurement 31, by summing node 44, will regulate the voltage on electrical load 17 to five volts by throttling amplifier 11 to a level that results in a five volt output on the load. It should be obvious to one skilled in the art that various signal processing stages are typically interposed within the regulation control stage 30 in order to control the rate of convergence and feedback stability. Additionally, implementation of the regulation feedback can be accomplished with any number of applicable control schemes including hysteretic, discontinuous control, proportional-integral-derivative (PID) control, and proportional-integral (PI) control.

The second controlled parameter, operational frequency, is managed by frequency control signal 21. Frequency control signal 21 controls the output frequency of amplifier 11. Frequency control signal 21 is generated by the voltage controlled oscillator 12 responsive to frequency control error signal 22. Frequency control error signal 22 is derived within frequency control stage 40. Frequency control stage 40 includes operating parameter measurement A block 41, operating parameter measurement B block 42, delay 43, and summing node 44. A primary function of frequency control stage 40 is to output frequency control error signal 22 that feeds voltage control oscillator 12 to continuously adjust amplifier 11 as to maintain an operational frequency that correlates to the desired operating point of piezoelectric transformer 2. It is important to note that the desired operating point is not necessarily associated with a fixed frequency; the operating point may shift as environmental and electrical loading conditions of the converter change, as shown in FIG. 1 and FIG. 2.

In keeping with the invention, frequency control feedback stage 40 provides a means to identify this shift in desired operating point, or to create a dynamic operating condition set-point, and then provide corrective adjustment to amplifier 11 via frequency control feedback signal 21. Operating parameter measurement A block 41 maintains an output proportional to the current operating point of a measured parameter of piezoelectric transformer 2, and takes its input from within power stage 10, typically at the input of piezoelectric transformer 2. Operating parameter measurement B block 42 maintains a second output proportional to the current operating point of a second measured parameter of piezoelectric transformer 2, and takes its input from within power stage 10, typically at the output of piezoelectric transformer 2. Delay 43 then performs a desired modification to the output of operating parameter measurement B block 42. The combination of delay 43 and the output of operating parameter measurement B block 42 creates a dynamic operating condition set-point, to be compared to the output of operating parameter measurement A block 41 by summing node 44. The output of summing node 44 contains the difference between the output of operational condition measurement A block 41 and the dynamic operating condition set-point, created by the output of operating parameter measurement B block 42 and delay 43. Therefore, summing node 44 returns frequency control error signal 22, thus controlling frequency of voltage controlled oscillator 12, and acting to provide continually adjusting corrective feedback to maintain the desired operating condition of piezoelectric transformer 2, through amplifier 11.

Alternatively, although not shown, the delay 43 my receive input from operating parameter measurement A block 41 and then create a dynamic operating condition set-point, to be compared to the output of operating parameter measurement B block 42 by summing node 44. The output of summing node 44 contains the difference between the output of operating parameter measurement B block 42 and the dynamic operating condition set-point, created by operating parameter measurement A block 41 and delay 43. Therefore, summing node 44 returns frequency control error signal 22, thus controlling frequency of voltage controlled oscillator 12, and acting to provide continually adjusting corrective feedback to maintain the desired operating condition of piezoelectric transformer 2, through amplifier 11.

The operating point measurements are generally accomplished by phase measurement of input and/or output parameters of the piezoelectric transformer where the output of the phase measurement consists of a logic signal with positive and negative edges corresponding to the positive and negative zero crossings of the measured transformer parameter. The outputs of the phase measurements can then be fed to a phase detector that returns an analog signal that corresponds to the magnitude of the difference of the measured phases. The phase difference magnitude is then fed to a voltage controlled oscillator creating a phase-locked loop.

For example, in some embodiments, operating parameter measurement A 41 and operating parameter measurement B 42 are composed of circuits to perform a phase measurement of the input and output voltage of piezoelectric transformer 2, respectively. The phase measurements typically consist of digitized pulse wave signals having positive and negative rising edges that correspond to the zero-crossings of the sinusoidal piezoelectric transformer voltage. The digitized pulse wave signals can then feed a phase difference detector circuit, or more fundamentally a summing node, in order to develop an analog signal representative of the error in phase between the measured parameters of the piezoelectric transformer. This analog error signal is utilized as a frequency control error signal to feed a voltage controlled oscillator creating a frequency controlled phase-locked loop about a specific operating point for the piezoelectric transformer. The output of the phase difference detector is typically filtered to smooth the signal and provide some level of control over the gain of the phase-locked loop. Additionally, a signal delay can be interposed between one of the operating parameter measurements and the phase difference detector circuit to control the respective operating point lock location that the phase-lock loop will maintain. For example, if no delay is interposed the phase-lock loop will continually adjust the frequency of the circuit to maintain a 0 degree phase margin between the input and output voltage of the piezoelectric transformer. If a 90 degree phase delay is interposed on the output voltage measurement, the phase-locked loop will continually adjust the frequency of the system to maintain a −90 degree phase margin between the input and output voltage of the piezoelectric transformer.

Figure 4:
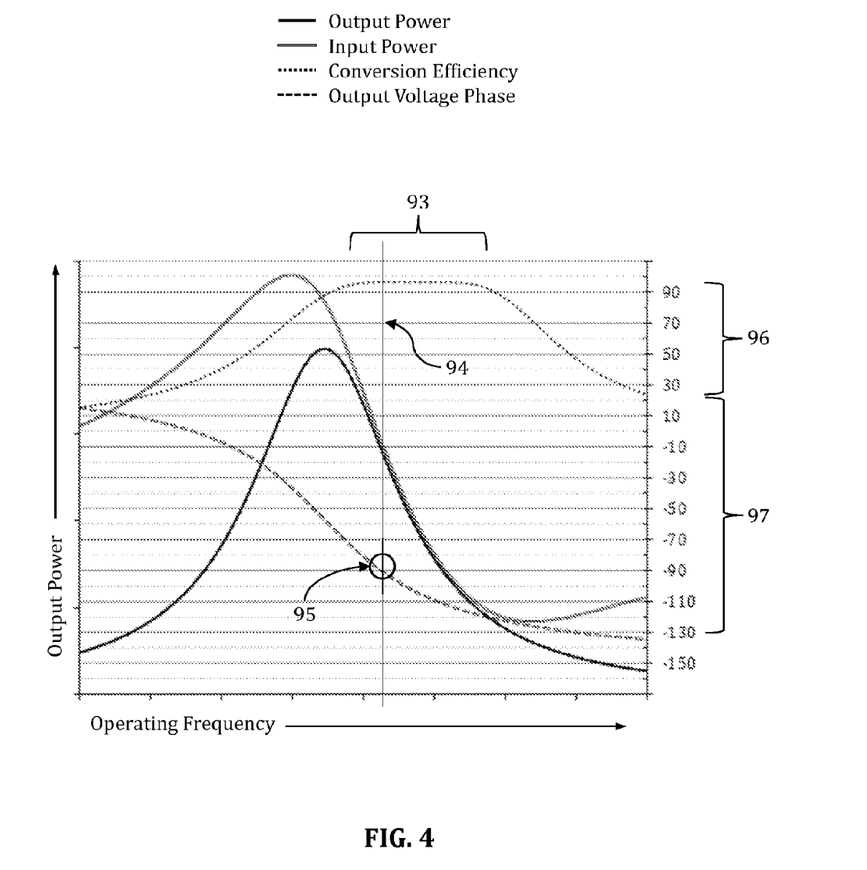
FIG. 4 shows a graph comparing the input power, output power, conversion efficiency, and output voltage phase of a piezoelectric transformer.

In accordance with the invention, in some embodiments, both the frequency control feedback stage as well as the regulation feedback stage can be implemented by digital means, wherein the applicable operating point measurement or magnitude measurements are digitized via an analog to digital converter. In this case, much of the processing of the respective feedback signals can be done via microprocessor or field programmable gate array. FIG. 4 depicts a frequency domain graph that includes the input power, output power, efficiency, and output voltage phase of a non-specific piezoelectric transformer. The graph of FIG. 4 demonstrates an example of the relationships between piezoelectric transformer performance and output voltage phase. The conversion efficiency is identified by area 96 and the right side axis labels within area 96 correlate to the efficiency in percentage. The output voltage phase is identified by area 97 and right side vertical the axis labels within the area correlate to phase angle in degrees. Point 95 depicts a representative phase lock location of −90°, while line 94 can be used to identify the intersecting locations for input/output power and conversion efficiency. In the example of FIG. 4, a phase lock location of −90° correlates to an area of both peak efficiency and significant power throughput. It is important to realize that additional methods for identification of the piezoelectric transformer operating condition exist, such as tracking the phase difference between input voltage and input current, and such methods are still applicable to integration within the present invention.

Figure 6:
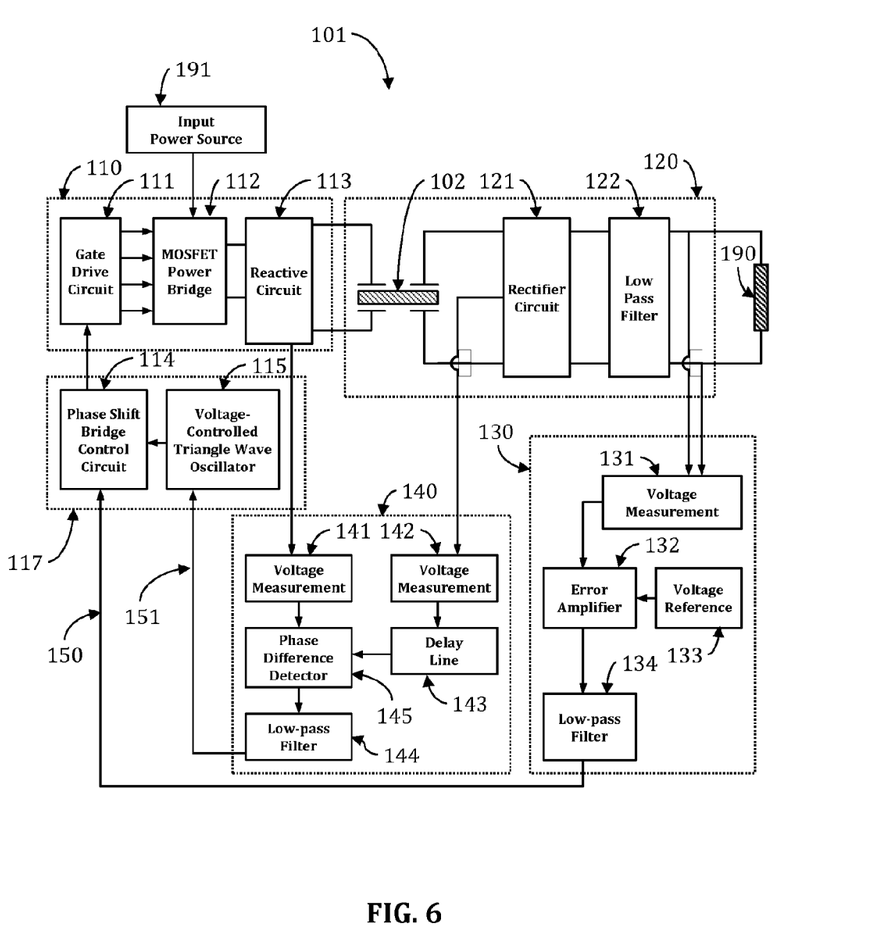
FIG. 6 shows a block diagram of a circuit in accordance with another embodiment of the invention.

FIG. 6 depicts an electrical system diagram of an embodiment of the present invention. The system can be separated into five logical subsystems; switch mode power circuit 110, output power stage 120, simultaneous control circuit 117, regulation control stage 130, and frequency control stage 140. The switch mode power circuit 110 consists of a gate drive circuit 111, MOSFET Power Bridge 112 and reactive circuit 113. The MOSFET Power Bridge 112 for this embodiment includes a four-switch MOSFET full-bridge, whereas the gate signals for the MOSFETs are supplied by the gate drive circuit 111. Reactive circuit 113 generally consists of a single inductor appropriately sized to resonate with the static capacitance of the piezoelectric transformer 102, although in some embodiments the circuit may consist of a more complex matching network of reactive electrical components, or in some other embodiments it can be omitted completely. In this embodiment, reactive circuit 113 provides the primary function of converting the square wave signal present at the output of MOSFET Power Bridge 112 to a sinusoidal voltage signal to appropriately drive piezoelectric transformer 102.

The output power stage 120 includes piezoelectric transformer 102, rectifier circuit 121, and low-pass filter 122. Electrical load 123 is then coupled to the output of the power stage, or more specifically the low-pass filer 122. Piezoelectric transformer 102's output signal is sinusoidal, therefore it is necessary to interpose a rectifier circuit 121 and low-pass filter 123, to create a direct current across the electrical load 190. In some embodiments, where an alternating current signal is required at electrical load 190, the rectifier and filter block may be omitted.

Regulation control stage 130 includes voltage measurement 131, error amplifier 132, voltage reference 133, and low-pass filter 134. The primary function of regulation control stage 130 is to provide a regulation control signal to switch mode power circuit 110 that's representative of the error between voltage reference 133 and voltage measurement 131. Within regulation control stage 130, voltage measurement 131 performs a voltage measurement of the voltage across the output of output power stage 120. The magnitude of voltage measurement 131 is then fed to error amplifier 132. Error amplifier 132 returns the difference, or error, between voltage measurement 132, and the voltage reference 133. Voltage reference 133 provides the set-point of the desired output voltage of the output power stage 120. The output of error amplifier 132 is passed through low-pass filter 134 prior to being fed to the phase shift bridge control circuit 114 as regulation control signal 150. Phase shift bridge control circuit 114 translates regulation control signal 150 to a change in the amount of power delivered through the switch mode power circuit 110 to piezoelectric transformer 102, thus performing the power throttling function of the converter circuit 101, providing continuous output voltage regulation.

Figure 5:
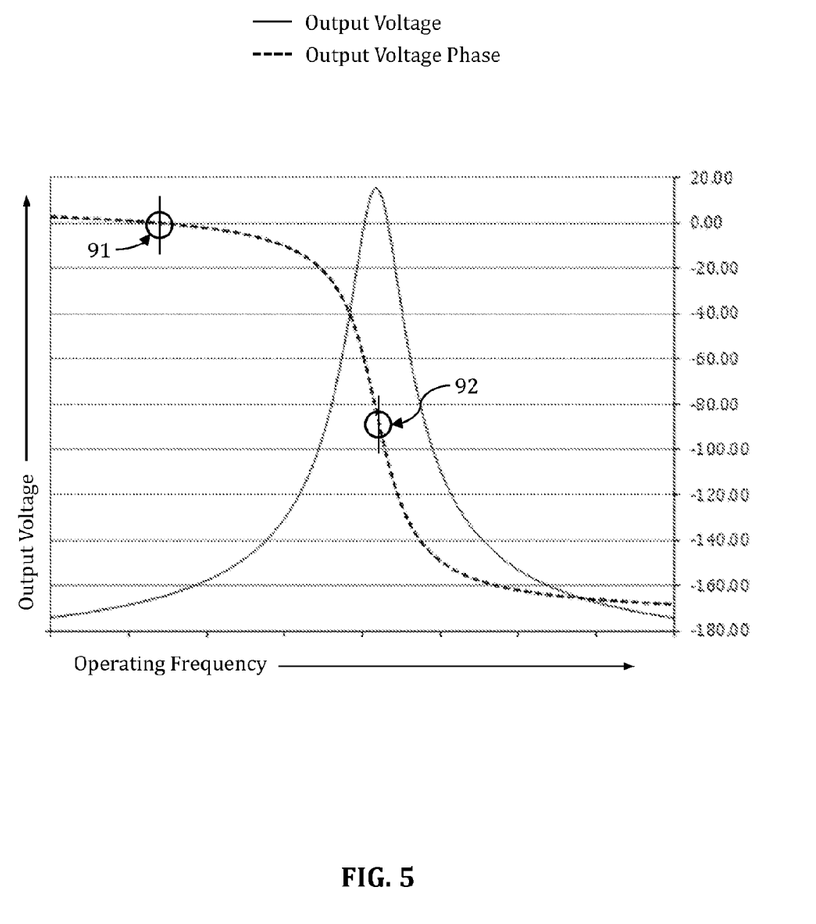
FIG. 5 depicts a graph of the output voltage and output voltage phase of a piezoelectric transformer.

Frequency control stage 140 consists of voltage measurement block 141, voltage measurement block 142, phase difference detector 145, delay line 143, and low-pass filter 144. The primary function of frequency control stage 140 is to provide a frequency control signal that's representative of the error between the phase of the output of voltage measurement block 141 and the phase of the output of voltage measurement block 142, after the output of voltage measurement block 142 has been delayed by delay line 143. Within frequency control stage 140 voltage measurement block 141 performs a phase measurement of the input voltage to piezoelectric transformer 102, and feeds phase difference detector 145 with one of two phase signals for comparison. Voltage measurement block 142 performs a phase measurement of the output voltage to piezoelectric transformer 102, and feeds phase difference detector 145 with a second phase signal through delay line 143 for comparison. Delay line 143 provides control of the set-point of the operating point lock location of frequency control stage 140. The operating point lock location typically corresponds to a specific phase angle between measured parameters of the piezoelectric transformer. FIG. 5 shows an example of different operating point lock locations for a non-specific piezoelectric transformer, and depicts output voltage and output voltage phase with respect to input voltage. Area 91 in FIG. 5 represents an operating point lock location of 0 degrees, it can be seen that this location corresponds to a relatively low output voltage for the transformer resonant condition shown. Area 92 in FIG. 5 represents an operating lock location of −90 degrees, and it correlates to the point of maximum voltage, or maximum gain, for the transformer resonant condition shown. The delay line enables modification of the operating lock location thus allowing a level of control over the piezoelectric transformer functional properties. For example, the operating lock location can be set to maintain a point of maximum efficiency, power, or output voltage for any applicable piezoelectric transformer. The output of phase difference detector 145 is fed through low-pass filter 144 prior to being fed to the voltage controlled oscillator 115 as frequency control signal 151. Voltage controlled oscillator 115 translates frequency control signal 151 to a change in the operational frequency of the switch mode power circuit 110 and thus the frequency of the amplified signal driving piezoelectric transformer 102, providing the continuous frequency tracking function of the converter circuit 101. Suitable voltage controlled oscillators include voltage controlled triangle wave oscillators, voltage controlled saw toothed, or ramp oscillators, and variable pulse width oscillators.

It should be obvious to one skilled in the art that the stages, blocks and systems described herein can be implemented by either analog circuits as described or digital systems. More particularly, the stages, blocks, and systems described herein may be implemented using printed circuit boards (PCB) with processor based logic, field programmable gate arrays (FPGA), application specific integrated circuits (ASIC), microcontrollers, CMOS logic and discrete logic hardware.

It should be noted that the present invention may, however, be embodied in many different forms and should not be construed as limited to the embodiments and prototype examples set forth herein; rather, the embodiments set forth herein are provided so that the disclosure will be thorough and complete, and will fully convey the scope of the invention to those skilled in the art. The accompanying drawings illustrate embodiment and prototype examples of the invention.

As used above "substantially," "generally," and other words of degree are relative modifiers intended to indicate permissible variation from the characteristic so modified. It is not intended to be limited to the absolute value or characteristic which it modifies but rather possessing more of the physical or functional characteristic than its opposite, and preferably, approaching or approximating such a physical or functional characteristic. "Substantially" also is used to reflect the existence of manufacturing tolerances that exist for manufacturing components.

Based on this disclosure, one of ordinary skill in the art will appreciate that the use of "same", "identical" and other similar words are inclusive of differences that would arise during manufacturing to reflect typical tolerances for goods of this type.

Those skilled in the art will appreciate that various adaptations and modifications of the exemplary and alternative embodiments described above can be configured without departing from the scope and spirit of the invention. Therefore, it is to be understood that, within the scope of the appended claims, the invention may be practiced other than as specifically described herein.

We claim:

1. A piezoelectric transformer power converter circuit comprising:
    a power stage including an amplifier with a controllable gain coupled to a piezoelectric transformer;
    a regulation control stage that generates a regulation control signal that is representative of an error between a desired electrical regulation set-point and a measured electrical parameter of the output of the power stage, said regulation control circuit including:
    a magnitude reference block providing a magnitude reference signal,
    a magnitude measurement block that measures a parameter of the load and generates a magnitude measurement signal, and
    a summing node that generates the regulation control signal;
    a frequency control stage that generates a frequency control error signal that is representative of an error between a first and second measured operating parameter of the power stage, said frequency control stage including:
    a first operating parameter measurement block that generates a first output phase signal responsive to a first measured parameter of the piezoelectric transformer,
    a second operating parameter measurement block that generates a second output phase signal responsive to a second measured parameter of the piezoelectric transformer,
    a delay that creates a phase delay in the second output phase signal and generates an operating condition set point signal, and
    a summing node that generates the frequency control error signal from a difference between the first output phase signal and the operating condition set point signal; and
    a voltage controlled oscillator that generates a frequency control signal having a periodic wave with a frequency controlled by the frequency control error signal;
    wherein the amplifier generates a piezoelectric drive signal, that includes an amplitude that is controlled by the regulation control signal, and a frequency that is simultaneously controlled by the frequency control signal, thereby maintaining a desired drive condition for an electrical load.

2. A piezoelectric transformer power converter circuit comprising
    a regulation control stage that generates a regulation control signal responsive to an electrical parameter measurement of the converter load,
    a frequency control stage that generates a frequency control signal responsive to an operating state measurement of a piezoelectric transformer, said frequency control circuit including:
    a first voltage measurement circuit that performs a phase measurement of input voltage of the piezoelectric transformer and generates a first phase signal,
    a second voltage measurement circuit that performs a phase measurement of the output voltage of piezoelectric transformer and generates a second phase signal,
    a delay line coupled to said second voltage measurement circuit that receives the second phase signal and creates a phase delay on the second phase signal, and
    a phase difference detector coupled to said first voltage measurement circuit and said delay line that outputs a signal corresponding to a difference in phase between the first phase signal and the delayed second phase signal; and
    a simultaneous control circuit that provides simultaneous control of the frequency and power output of a switch-mode power circuit responsive to the regulation and frequency control signal, said simultaneous control circuit including:
    a voltage controlled oscillator that generates a periodic output signal having a frequency dictated by the frequency control signal, and
    a phase shift bridge control circuit that generates a set of signals that control a frequency and power output of a switch-mode power circuit responsive to the regulation and frequency control signals.

3. A method of operation of a piezoelectric transformer power converter having a power stage, a regulation control stage, and a frequency control stage, the method comprising:
    measuring a parameter of an output of the power stage;
    generating a regulation control signal that is representative of the error between a desired electrical regulation set-point and a measured electrical parameter of the output of the power stage;
    measuring a first operating parameter and a second operating parameter of a power stage;
    generating a frequency control error signal that is representative of the error between the first and second measured operating parameters of the power stage; and
    generating a frequency control signal having a periodic wave with a frequency responsive to the frequency control error signal;
    generating a drive signal for a piezoelectric transformer that simultaneously controls (i) input power from a coupled input power source responsive to the regulation control signal, and (ii) operational frequency of the piezoelectric transformer responsive to the frequency control signal;
    wherein one of the first and second operating parameter measurements is subjected to a phase delay thereby controlling an operating point lock location of the piezoelectric transformer.

4. The method of operation of the piezoelectric transformer power converter of claim 3 further comprising:
    generating an AC output signal of the piezoelectric transformer responsive to the piezoelectric transformer drive signal; and rectifying an AC output signal of the piezoelectric transformer to generate a DC output signal of the power stage.

* * * * *